United States Patent
Hollander et al.

(10) Patent No.: US 7,665,067 B2
(45) Date of Patent: Feb. 16, 2010

(54) METHOD AND SYSTEM FOR AUTOMATICALLY CREATING TESTS

(75) Inventors: Yoav Hollander, Kiryat Ono (IL); Yaron Kashai, Sunnyvale, CA (US)

(73) Assignee: Cadence Design (Israel) II Ltd., Rosh Ha'ayin (IL)

( * ) Notice: Subject to any disclaimer, the term of this patent is extended or adjusted under 35 U.S.C. 154(b) by 719 days.

(21) Appl. No.: 10/661,772

(22) Filed: Sep. 15, 2003
(Under 37 CFR 1.47)

(65) Prior Publication Data
US 2005/0060132 A1    Mar. 17, 2005

(51) Int. Cl.
*G06F 9/44* (2006.01)
(52) U.S. Cl. .................................................... 717/124
(58) Field of Classification Search ......... 717/124–131, 717/148–149; 710/100
See application file for complete search history.

(56) References Cited

U.S. PATENT DOCUMENTS

| | | | | |
|---|---|---|---|---|
| 6,073,194 | A * | 6/2000 | Lowe .......................... | 710/100 |
| 6,081,864 | A * | 6/2000 | Lowe et al. .................. | 710/100 |
| 6,154,801 | A * | 11/2000 | Lowe et al. .................. | 710/119 |
| 6,173,243 | B1 * | 1/2001 | Lowe et al. .................... | 703/14 |
| 6,182,258 | B1 | 1/2001 | Hollander | |
| 6,581,052 | B1 * | 6/2003 | Slutz ............................. | 707/2 |
| 6,625,797 | B1 * | 9/2003 | Edwards et al. ............... | 716/18 |
| 6,675,138 | B1 | 1/2004 | Hollander | |
| 6,698,012 | B1 * | 2/2004 | Kossatchev et al. ......... | 717/126 |
| 6,708,324 | B1 * | 3/2004 | Solloway et al. ............ | 717/124 |
| 6,769,114 | B2 * | 7/2004 | Leung ......................... | 717/124 |
| 6,845,440 | B2 * | 1/2005 | Thompson et al. .......... | 711/220 |
| 6,986,125 | B2 * | 1/2006 | Apuzzo et al. .............. | 717/124 |
| 6,993,747 | B1 * | 1/2006 | Friedman ..................... | 717/124 |
| 7,117,484 | B2 * | 10/2006 | Hartman et al. ............. | 717/126 |
| 7,210,087 | B2 * | 4/2007 | Mukai et al. ................. | 714/742 |
| 2002/0040457 | A1 * | 4/2002 | Noy ............................. | 714/724 |
| 2002/0182579 | A1 * | 12/2002 | Driscoll et al. .............. | 434/350 |
| 2004/0093476 | A1 * | 5/2004 | Thompson et al. .......... | 711/220 |

OTHER PUBLICATIONS

Iyer, MA, "A Robust and Scalable Technique for the Constraints Solving Problem in High-Level Verification", IEEE Transation on Circuits and Systems for Video Technology, pp. 95-100, 2003.
Hollander, Y, "The e-Language: a Fresh Separation of Concents",Proc. Technol. Of Object-Oriented Languages and Systems. Toos, 38 IEEE, pp. 41-50, 2001.

* cited by examiner

Primary Examiner—Philip Wang
(74) Attorney, Agent, or Firm—Rosenberg, Klein & Lee (57) ABSTRACT

A system and method for generalized scenarios, for automatically generating tests. The tests are generated from some underlying structure, such as one or more scenarios. The scenarios preferably include a plurality of constraints for generating a test program for generating input values to the test generation process. The scenarios provide a more generalized method for generating tests.

23 Claims, 4 Drawing Sheets

METHOD AND SYSTEM FOR AUTOMATICALLY CREATING TESTS

FIELD OF THE INVENTION

This invention relates to computer software, more particularly to computer software for analyzing the functionality of a circuit design and for analyzing the functional correctness of the circuit design.

BACKGROUND OF THE INVENTION

The field of electronic design automation (EDA) is well established. A number of software tools are used to describe a circuit at various levels of granularity or specificity. Such tools include gate level descriptions, which specify the circuit in very great detail, to high level descriptions written in hardware description languages such as Verilog or VHDL. The process of verifying a design through a simulation model of the device is aided by the availability of Verilog and VHDL. These languages are designed to describe hardware both at higher levels of abstraction and as gates or transistors, thus enabling designers to describe the elements and connections between elements of a circuit. Modern circuits have many millions of transistors, so it is essential to use some sort of design tools just to manage the complexity of the design, particularly for design verification.

Design verification is the process of determining whether an integrated circuit, board, or system-level architecture, exactly implements the requirements defined by the specification of the architecture for that device. Design verification for a device under testing (DUT) may be performed on the actual device, or on a simulation model of the device. For the purposes of explanation only and without intending to be limiting in any way, the following discussion centers upon testing which is performed on simulation models of the device.

As designs for different types of devices and device architectures become more complex, the likelihood of design errors increases. However, design verification also becomes more difficult and time consuming, as the simulation models of the design of the device also become more complex to prepare and to test.

The problem of design verification is compounded by the lack of widely generalizable tools which are useful for the verification and testing of a wide variety of devices and device architectures. Typical background art verification methods have often been restricted to a particular device having a specific design, such that the steps of preparing and implementing such verification methods for the simulation model must be performed for each new device.

As previously described, the process of verifying a design through a simulation model of the device is aided by the availability of hardware description languages such as Verilog and VHDL. The resultant simulated model of the device can receive input stimuli in the form of test vectors, which are a string of binary digits applied to the input of a circuit. The simulated model then produces results, which are checked against the expected results for the particular design of the device. However, these languages are typically not designed for actual verification. Therefore, the verification engineer must write additional programming code in order to interface with the models described by these hardware description languages in order to perform design verification of the device.

Examples of testing environments include static and dynamic testing environments. A static testing environment drives pre-computed test vectors into the simulation model of the DUT and/or examines the results after operation of the simulation model. In addition, if the static testing environment is used to examine the results which are output from the simulation model, then errors in the test are not detected until after the test is finished. As a result, the internal state of the device at the point of error may not be determinable, requiring the simulation to be operated again in order to determine such internal states. This procedure consumes simulation cycles, and can require the expenditure of considerable time, especially during long tests.

A more useful and efficient type of testing is a dynamic testing environment. For this type of environment, a set of programming instructions is written to generate the test vectors in concurrence with the simulation of the model of the DUT and while potentially being controlled by the state feedback of the simulated device. This procedure enables directed random generation to be performed and to be sensitive to effects uncovered during the test itself on the state of the simulation model of the device. Thus, dynamic test generation clearly has many advantages for design verification.

Within the area of testing environments, both static and dynamic testing environments can be implemented only with fixed-vector or pre-generation input. However, a more powerful and more sophisticated implementation uses test generation to produce the environment, particularly for functional verification in order for the various elements be defined and connected together correctly in order to have the circuit perform as specified. Specman Elite™, software developed by Verisity Ltd. in Israel and available through Verisity Design, Inc. in Mountain View, Calif., is the market leader in providing functional verification. Certain attributes of the software are described in copending, commonly assigned U.S. patent application Ser. No. 09/327,966, entitled "System and Method for Measuring Temporal Coverage Detection", filed Jun. 8, 1999, and incorporated herein in full by reference. Useful background information is presented in commonly assigned U.S. Pat. No. 6,182,258, filed Feb. 6, 1998 and issued Jan. 30, 2001, entitled "Method and Apparatus for Test Generation During Circuit Design", also hereby incorporated by reference.

The test generator disclosed in U.S. Pat. No. 6,182,258 interacts with, and sits as a higher level over, such hardware description languages as Verilog and VHDL. The test generation procedure is written in a hardware-oriented verification specific object-oriented programming language. This language is used to write various test programs (which may be also called tests), which are then used to automatically create a device verification test by a test generator module. A wide variety of design environments can be tested and verified with this language. Thus, the disclosed procedure is generalizable, yet is also simple to program and to debug by the engineer.

However, the reliance on human intervention is still highly problematic. In particular, human intervention is costly and also slows the process of testing. Furthermore, any aspect of a testing process that requires human intervention represents a potential bottleneck for the rapid and efficient performance of the testing process. As can be seen from the above description, testing processes which minimize human intervention, while maximizing the value and effect of such intervention, are clearly more desirable. Although significant progress has been made toward these goals, currently available testing systems still require significant human intervention, at least at the level of test creation.

SUMMARY OF THE INVENTION

The background art does not teach or suggest a method for truly automatic test program creation and generation. The background art also does not teach or suggest a method for generating a test program from a general description of such a program and/or of the goals to be achieved by a test generated through such a test program.

The present invention overcomes these disadvantages of the background art by providing generalized scenarios for automatic test program generation, for design verification of a DUT (device under test). The tests themselves (instances of tests), which are generated by and/or through the test program, are performed on a simulation model of the DUT; however, it should be noted that the terms "DUT" and "simulation model" are used interchangeably in the context of the testing and verification process.

The present invention is of a system and method for automatically generating such test programs according to a generalized mechanism. By "generalized mechanism", it is meant that in place of having the user prepare a complete test program, the user may instead only create guidance for how the tests are to be generated. In the background art, as for example in co-assigned U.S. Pat. No. 6,182,258, previously incorporated by reference, the user creates a test program, which is loaded into the system and guides the test generator to generate tests. One such program can generate a multitude of tests because of the process of randomization. The present invention extends and generalizes the process of creating a test program, by allowing the user to only create guidance for test generation. As described below, such guidance may optionally include an at least partially automatic process for generating the code for the test program, and/or a process of selecting code for the test program from a plurality of choices, for example.

One or more scenarios are defined for the operation of the present invention. These scenarios undergo a generation phase to create a "program instance" or a test program as described above. The program instance then undergoes generation to create a test instance (or test) as in the background art.

The present invention may optionally be performed in a two stage (or even multistage) process, or alternatively as one continuous stage. The former embodiment is implemented when external files, such as HDL files for example, need to be generated. These files are generated in a separate stage from the generation of the scenarios etc, before the test program can be run.

The first, more general implementation, starts with a plurality of scenarios being input by the user or otherwise provided. These scenarios are provided with (optionally) one or more meta data elements and one or more constraints indicating at least which scenarios may be combined together in a particular test program, and which are in conflict. Preferably, the constraint(s) are also provided for the test generation itself, as described in greater detail below. A selection is then made from these scenarios, including at least one such scenario but preferably including a plurality of (non-conflicting) scenarios. This selection is done by resolving the constraints associated. The selected scenario(s) are then combined in a combination phase, to form a combined scenario instance. This combination is then used to generate a test program at run time, in a generation phase, which is actually a continuation of the combination phase; the two phases are described separately herein for the purposes of description only and without any intention of being limiting.

According to an optional but preferred embodiment of the present invention, a plurality of scenarios is combined together during the combination phase. These scenarios are optionally and more preferably selected from a group of scenarios which may optionally contain potentially conflicting scenarios. The scenarios selected from this group and combined in the combination phase are a non conflicting subset of the group. One or more scenarios are more preferably sequences.

A sequence is a scenario that describes an application of a stimulus over time. As such a sequence includes at least one process which comprises a generation operation in which a data item is created and a driving operation in which said data item is applied. A sequence preferably comprises multiple such processes, with synchronization operations interleaved between the steps.

Sequences are optionally and preferably implemented as an e language construct which provides a "mini-test". Although sequences may optionally be used with code generation, such code generation is not required for generating a test program. Sequences preferably define streams of data items (code instructions for the test program). Sequences are paired with sequence drivers, which enable the sequence to be operative for generating a test.

For the present invention, one or more sequences may optionally be selected for forming the test program. More preferably, one sequence is able to call the next sequence to be able to construct the test program from a plurality of sequences.

According to an optional but preferred embodiment of the present invention, the constraint(s) preferably also comprise a description of a type of expected variable and a type of operation to be performed on the expected variable. For example, the operation could optionally comprise a sampling process for a variable of the simulation model for simulating the DUT (device under test), again as previously described for the test program which would then generate the test.

According to an optional but preferred embodiment of the present invention, the test program is generated through a two stage generation process. The first stage of the generation process preferably includes the creation of code, such as a HDL (hardware description language) file and also verification language code, such as e code for example. One or more of the file(s) created in the first stage may optionally require compilation prior to use during the second stage. The second stage of the generation process preferably includes reading in some of the code generated in stage one and the generation of one or more actual test programs based at least in part on the code generated during stage one. The second stage may optionally be performed according to a randomized or semi-randomized process. It should be noted that the second stage may optionally include both pre-run time and also run-time processes, such that there is not necessarily a one-to-one mapping between "first and second stages" and "pre-run time and run-time generation processes".

It should also be noted that the automatic test program generation according to the present invention should be distinguished from previously known test generation processes in that the generation process according to the present invention includes at least one process for generating data that is subsequently used for generating values for the test inputs.

BRIEF DESCRIPTION OF THE DRAWINGS

The attached figures illustrate certain aspects of the invention but are not meant to be limiting in any way.

DETAILED DESCRIPTION OF THE PREFERRED EMBODIMENTS

The present invention is of a method for generating test programs according to generalized guidance, rather than according to a completely predefined set of rules or instructions. According to this method, one or more scenarios are defined for the operation of the present invention. These scenarios undergo a generation phase to create a "program instance" or a test program as described above. The program instance then undergoes generation to create a test instance (or test) as in the background art, as described for example in co-assigned U.S. Pat. No. 6,182,258.

The present invention may optionally be performed in a two stage (or even multistage) process, or alternatively as one continuous stage. The former embodiment is implemented when external files, such as HDL files for example, need to be generated. These files are generated in a separate stage from the generation of the scenarios etc, before the test program can be run.

The first, more general implementation, starts with a plurality of scenarios being input by the user or otherwise provided. These scenarios are provided with one or more constraints, indicating at least which scenarios may be combined together in a particular test program, and which are in conflict. Preferably, the constraint(s) are also provided for the test generation itself, as described in greater detail below. A selection is then made from these scenarios, including at least one such scenario but preferably including a plurality of (non-conflicting) scenarios. This selection is done by resolving the constraints associated. The selected scenario(s) are then combined in a combination phase, to form a combined scenario instance. This combination is then used to generate a test program at run time, in a generation phase, which is actually a continuation of the combination phase; the two phases are described separately herein for the purposes of description only and without any intention of being limiting.

According to an optional but preferred embodiment of the present invention, a plurality of scenarios is combined together during the combination phase. These scenarios are optionally and more preferably selected from a group of scenarios which may optionally contain potentially conflicting scenarios. The scenarios selected from this group and combined in the combination phase are a non conflicting subset of the group. One or more scenarios are more preferably sequences.

A sequence is a scenario that describes an application of a stimulus over time. As such a sequence includes at least one process which comprises a generation operation in which a data item is created and a driving operation in which said data item is applied. A sequence preferably comprises multiple such processes, with synchronization operations interleaved between the steps.

Sequences are optionally and preferably implemented as an e language construct which provides a "mini-test". Although sequences may optionally be used with code generation, such code generation is not required for generating a test program. Sequences preferably define streams of data items (code instructions for the test program). Sequences are paired with sequence drivers, which enable the sequence to be operative for generating a test.

For the present invention, one or more sequences are optionally and preferably selected for forming the test program. More preferably, one sequence is able to call the next sequence to be able to construct the test program from a plurality of sequences.

Sequences may optionally comprise patterns of objects that are being generated according to a particular order. An example would be a sequence of CPU instructions, or a sequence of ATM cells. The pattern may optionally have some unique attributes such as "start with a load instruction, then perform some random/pseudo-random operation, and end with a store to the same address".

According to an optional but preferred embodiment of the present invention, the constraint(s) preferably also comprise a description of a type of expected variable and a type of operation to be performed on the expected variable. For example, the operation could optionally comprise a sampling process for a variable of the simulation model for simulating the DUT (device under test), again as previously described for the test program which would then generate the test.

The constraint may optionally include a static constraint on a value of the type of expected input variable. The constraint may optionally (alternatively or additionally) include a dynamic constraint on this value. The previously described one or more rules preferably controls at least one characteristic of the constraint, such as whether a plurality of constraints are operable together or whether a constraint conflicts with another such constraint, for example.

The type of operation may also optionally (alternatively or additionally) include a monitoring operation for monitoring behavior of the simulation model. The simulation model typically includes a plurality of variables, such that the monitoring operation preferably includes sampling at least one value of at least one variable of the simulation model.

The type of expected input variable may optionally and preferably be at least partially determined according to a simulation model of the DUT.

According to an optional but preferred embodiment of the present invention, the test program is generated through a two stage generation process. The first stage of the generation process preferably includes the creation of code, such as a HDL (hardware description language) file and also verification language code, such as e code for example. The second stage of the generation process preferably includes reading in some of the code generated in stage one and the generation of one or more actual test programs based at least in part on the code generated during stage one. The second stage may optionally be performed according to a randomized or semi-randomized process. It should be noted that the second stage may optionally include both pre-run time and also run-time processes, such that there is not necessarily a one-to-one mapping between "first and second stages" and "pre-run time and run-time generation processes".

Figure 1:
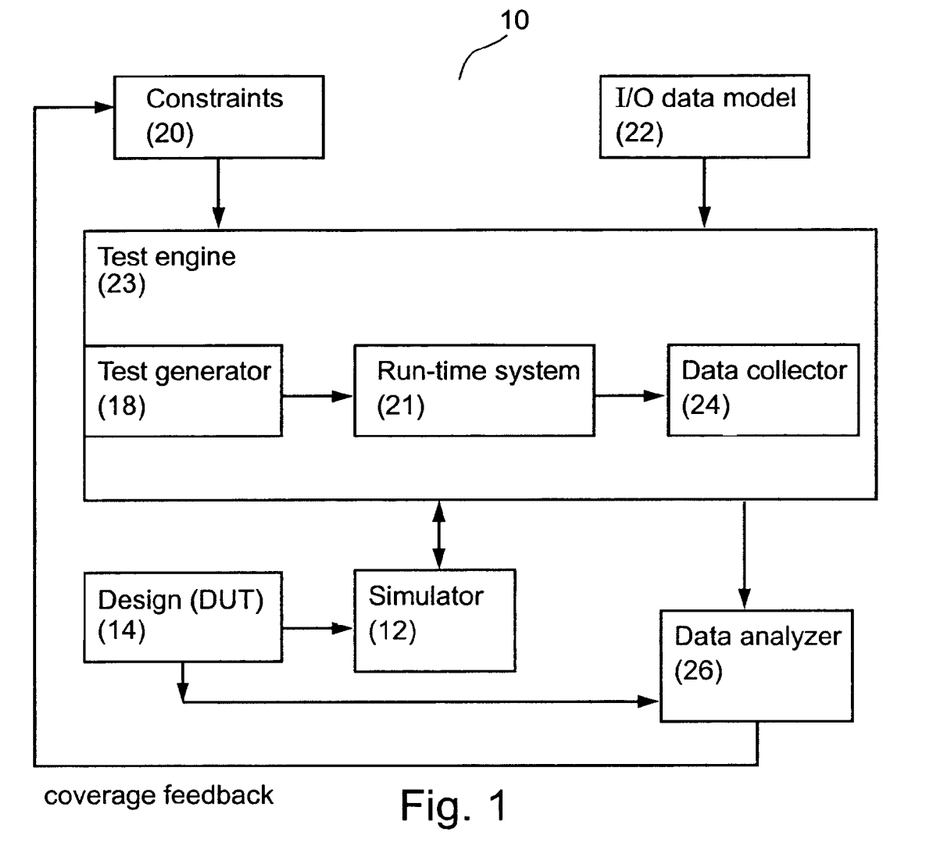
FIG. 1 illustrates the traditional Specman™ "e" test environment, and a DUT (physical or simulated or both) interacting through Specman Elite™ software to test the DUT for functional accuracy.

Referring now to the drawings, FIG. 1 is a schematic block diagram illustrating an exemplary system according to the present invention for test generation. It should be noted that the illustrated system only includes those general functions of the test generation procedure which are required for the description of the present invention. A more complete description of the entire test generation procedure may be found in U.S. Pat. No. 6,182,258, previously incorporated by reference. It should also be noted that although the present invention is described in the context of a simulation model, the present invention is also useful for verification of a physical device. Both the physical device and the simulation model can be described as a DUT (device under test), which is in a test environment.

A test generation system 10 according to the present invention features a simulator 12, which may accept a design 14 for the device under test (DUT), written in a hardware descriptive language such as Verilog or VHDL. In addition, simulator 12 interacts with a test engine 16 for performing the test generation procedure at run-time. The interaction between simulator 12 and test engine 16 is shown as bi-directional, since test engine 16 provides input to simulator 12, and in turn receives the results from simulator 12 as input for further operation.

Test engine 16 features a test generator 18, connected to a run-time system 21 for testing DUT 14 at run-time. Test generator 18 receives a set of constraints 20 and an I/O data model 22, and then performs the testing and verification of DUT 14. Constraints 20 may optionally include at least one set of a plurality of dynamic constraints. Run-time system 21 both drives and samples simulator 12 during the run-time testing procedure.

During the process of testing and verification, a data collector 24 requests the values for one or more variables from run-time system 21. These requests are optionally performed according to a triggering event emitted by run-time system 21. For example, for collection of data related to temporal coverage, such a triggering event is optionally a fixed, predefined sampling time and/or the occurrence of a temporal pattern of state transitions as defined by a temporal expression given in a temporal language, for example. Data collector 24 is able to communicate with test generator 18 and to access the requested data through the API (application programming interface) for test generator 18. Such an API specifies the software function calls required in order to collect the desired data. This collected data is then analyzed by a data analyzer 26. The information obtained from the analysis by data analyzer 26 is then preferably used to create new tests and/or adjust one or more constraints at constraints 20.

According to a preferred embodiment of the present invention, constraints 20 and I/O data model 22 are preferably constructed in e code, which is the code language provided by the Specman™ functional programming environment (Verisity Design, Inc., Mountain View, Calif., USA) and disclosed in U.S. Pat. No. 6,182,258, previously incorporated by reference. Such an embodiment is preferred because of the ease and flexibility of programming in e code.

The e code language is a hardware-oriented verification specific object-oriented programming language. Objects in this language are instances of "structs", which contain a field, and one or more functions, or methods, which operate on data stored within the field and which interact with other objects. Optionally, a constraint can operate on the field, thereby altering the data stored in the field, for example by restricting the range of possible values for the data. The field can also be used to store more complex structures, including other structs and lists of scalars or structs.

The process of test generation fills data elements, including structs and fields, with random values. The possible data values for each element can optionally be limited by constraints, which provide the direction for the directed test generation. For dynamic constraints, a selected, specific solution is preferably provided according to the present invention for each instance of test generation, as described with regard to PCT Application No. PCT/IL01/01011 (published as WO 02/37340). This solution is then used to provide limitations on the generated data values.

Figure 2:
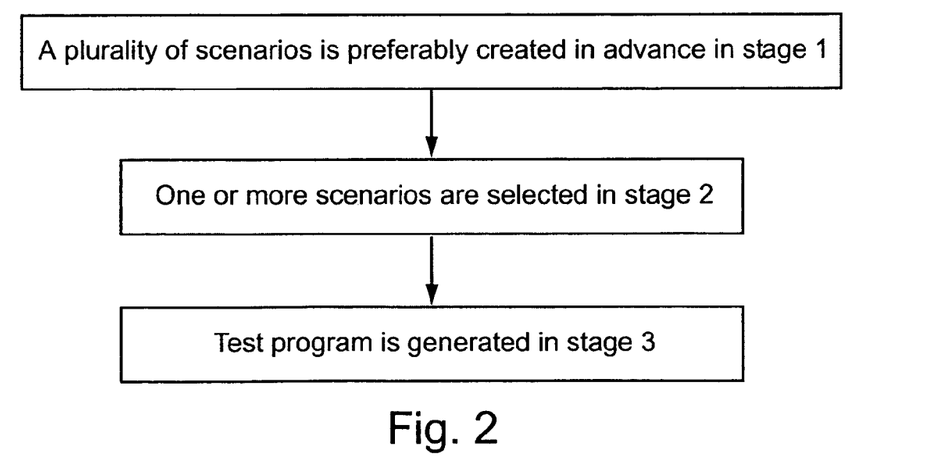
FIG. 2 is a flowchart of an exemplary method according to the present invention for generating a test program.

FIG. 2 is a flowchart of an exemplary method according to the present invention for generating a test program. As shown, a plurality of scenarios is preferably created in advance, as shown in stage 1. Each scenario preferably includes a plurality of constraints which may optionally be used to generate instructions for the test program.

As an example, currently (without the present invention) an illustrative test program could optionally be written in the e language as follows (the example is intended to detect an overflow of large packets, which are defined in this example as packets that are larger than a particular given size, as defined with regard to the "packet" struct):

```
extend sys {
    keep buffer_size == 0;
};
extend packet {
    keep len > 100;
};
```

For the present invention, the instructions are preferably written in the e language as follows. First, the following type is preferably predefined for the sys file as follows:

```
Type scenario_kind: [ ];
Extend sys {
    Scenario: scenario_kind;
};
```

Next, the following more generalized structure would preferably be created, for guiding the generation of the test program:

```
extend scenario_kind: [big_packets_overflow];
extend sys {
    keep scenario == big_packets_overflow =>
        buffer_size ==0;
};
extend packet {
    keep sys. scenario == big_packets_overflow => len > 100;
};
```

Next a scenario is preferably selected for generating the test program in stage 2. The scenario contains the necessary constraint(s) and instructions for generating the test as described above. The process of selection is optionally and preferably performed according to type or configuration of the DUT.

Optionally and preferably, this stage includes selecting a plurality of scenarios according to their respective constraint (s), to avoid conflicts between the scenarios. Next, these selected scenarios are preferably combined to form a combined scenario instance.

The test program is then preferably generated from the scenario and/or combined scenario instance in stage 3.

As previously described, this type of generation process for a test program may optionally be performed with sequences, an e language construct. A sequence is preferably created as follows. First, the sequence is defined by using the sequence statement. Next, the code is modified to inherit from such a defined sequence. The sequence driver is then hooked into the test environment (this "hook" enables the sequence driver to operate the instructions of the sequence for generating a test program).

An illustrative non-limiting example for generalized scenarios is provided below.

TEST 1—Overflow

```
<'
// Assume there is a packet type
// A test file for creating overflow conditions
extend sys {
    // buffer_size is a system parameter defining the size of
    // the buffer holding the data of the packets - many packets
    // with big data may cause an overflow
    keep buffer_size <= 2; // That will force an overflow...
};
extend packet {
    keep len > 100; // Big data will cause overflow ...
};
'>
```

TEST 2—Small Packets, no Overflow

```
<'
// A test file for creating small packets
extend packet {
    keep len < 20; // Force data to be small...
};
'>
```

SMALL/BIG tests (in which a value for a parameter is made very small and/or very large as a test of extreme edge conditions) may be provided through the following generalized scenario which is capable of creating either condition.

```
<'
Type scenario_kind: [ ];
Extend sys {
    Scenario: scenario_kind;
};
// Scenario 1
extend scenario_kind: [big_packets_overflow];
extend sys {
    keep scenario == big_packets_overflow => buffer_size ==0;
};
extend packet {
    keep sys. scenario == big_packets_overflow => len > 100;
};
// Scenario 2
extend scenario_kind: [small_packets];
extend packet {
    keep sys. scenario == small_packets => len <= 20;
};
'>
```

It should be noted that generating the Scenario field above will result in the choice of one of the two scenarios defined, and all subsequently generated packets will be generated accordingly.

GOOD/BAD tests provide a test for conditions in which some input data is not correct. For the example below, the scenarios are enhanced with some sequences that are mixed in.

```
extend packet_sequence_kind: [two_good_one_bad, all_good_
    and_wait];
<'
// Assume a packet_sequence is defined
extend two_good_one_bad packet_sequence {
    body( ) @driver.clock is {
        do packet keeping {.kind == GOOD};
        do packet keeping {.kind == GOOD};
        do packet keeping {.kind == BAD};
    };
};
extend all_good_and_wait packet_sequence {
    num_packets     :uint;
    body( ) @driver.clock is {
        for i from 1 to num_packets {
            do packet keeping {.kind == GOOD};
        };
        wait cycle;
    };
};
'>
```

The following example demonstrates that by loading both BIG/SMALL and GOOD/BAD scenarios, the following variability may optionally be generated. For example, first select a case of either big or small packets (which are selected once per test, and are mutually exclusive). Next, throughout the test keep selecting a sequence from the two sequences defined. Packets may then be generated according to the sequence.

For example, the following pseudo-instructions may optionally be performed, in which the items starting with the symbol "->" are the expected response to the listed commands:

```
- choose with SMALL packets
    choose two_good_one_bad
        -> small good packet
        -> small good packet
        -> small bad packet
    choose all_good_and_wait
        -> small good packet
        ....
        wait.
    ---
```

Figure 3:
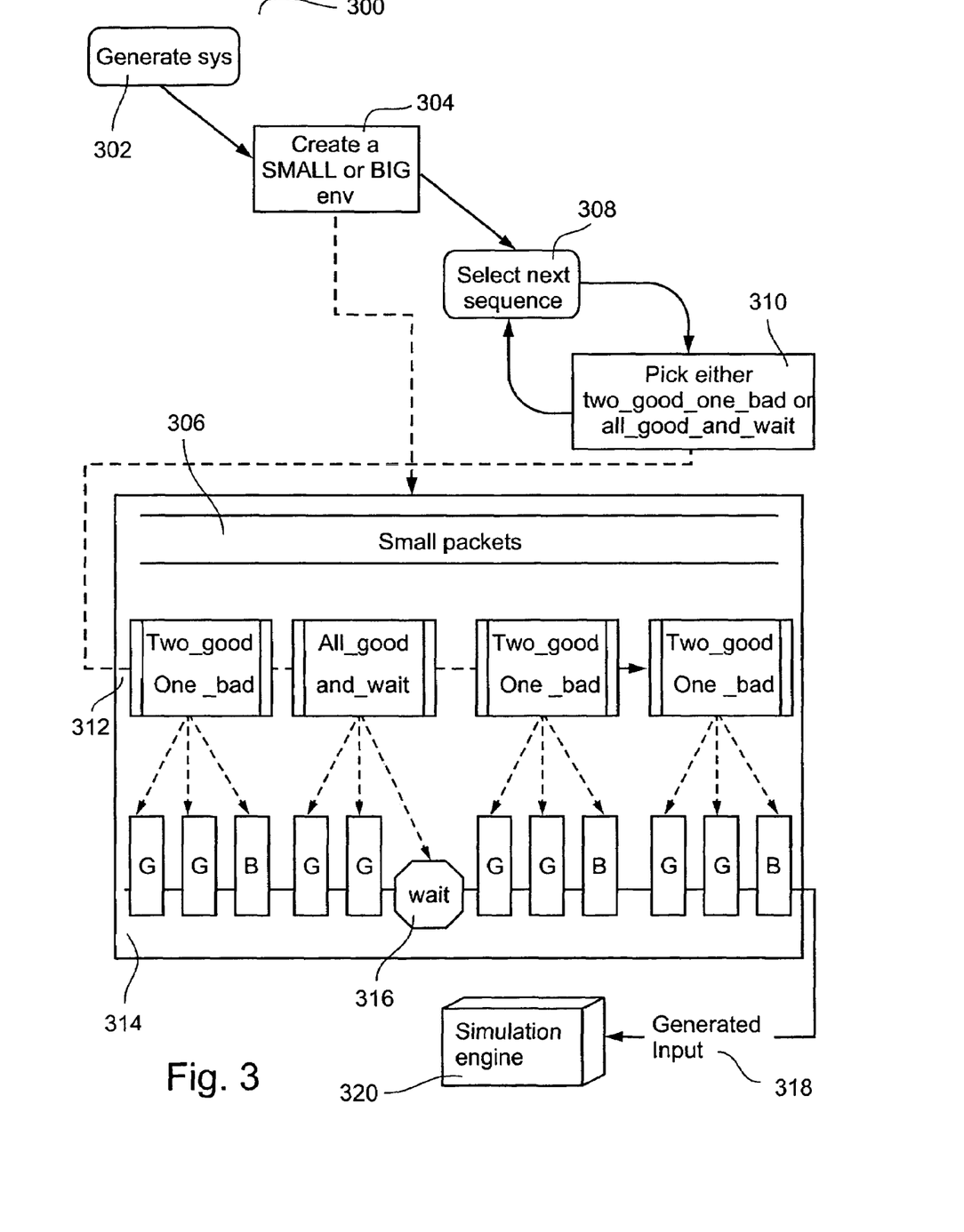
FIG. 3 is a schematic block process diagram of an example of the method according to FIG. 2 for test generation.

FIG. 3 is a schematic block process diagram of an example of the method according to FIG. 2 for test generation. As shown, a system process 300 preferably starts with a generate sys command 302 for initializing the process. Next, in process 304, one of the mutually exclusive SMALL or BIG scenarios is selected, for determining packet size in this example. The constraint in the selected scenario (for this example, the SMALL scenario) results in the packet size being limited according to the "SMALL" constraint 306.

The process continues with another, non-conflicting scenario being selected by selecting a sequence 308. The selected sequence 310 involves producing either two "good" packets and one "bad" packet, or all "good" packets and then waiting. It should be noted that the terms "good" and "bad"

are simply attributes, or enumerated values assigned to a variable. This classification typically relates to a packet containing valid data which is GOOD, as opposed to a packet containing corrupt data or bad error correction signature which is BAD. Of course any other attributes could be used in place of this particular exemplary classification. This selection feeds into the process of test generation for "good" or "bad" packet instructions at packet generator 312; the packet instructions themselves are shown as packets 314 that are "good" (G) or "bad" (B); waiting is shown as wait 316. The process ends by producing generated input 318 for simulation engine 320.

Figure 4:
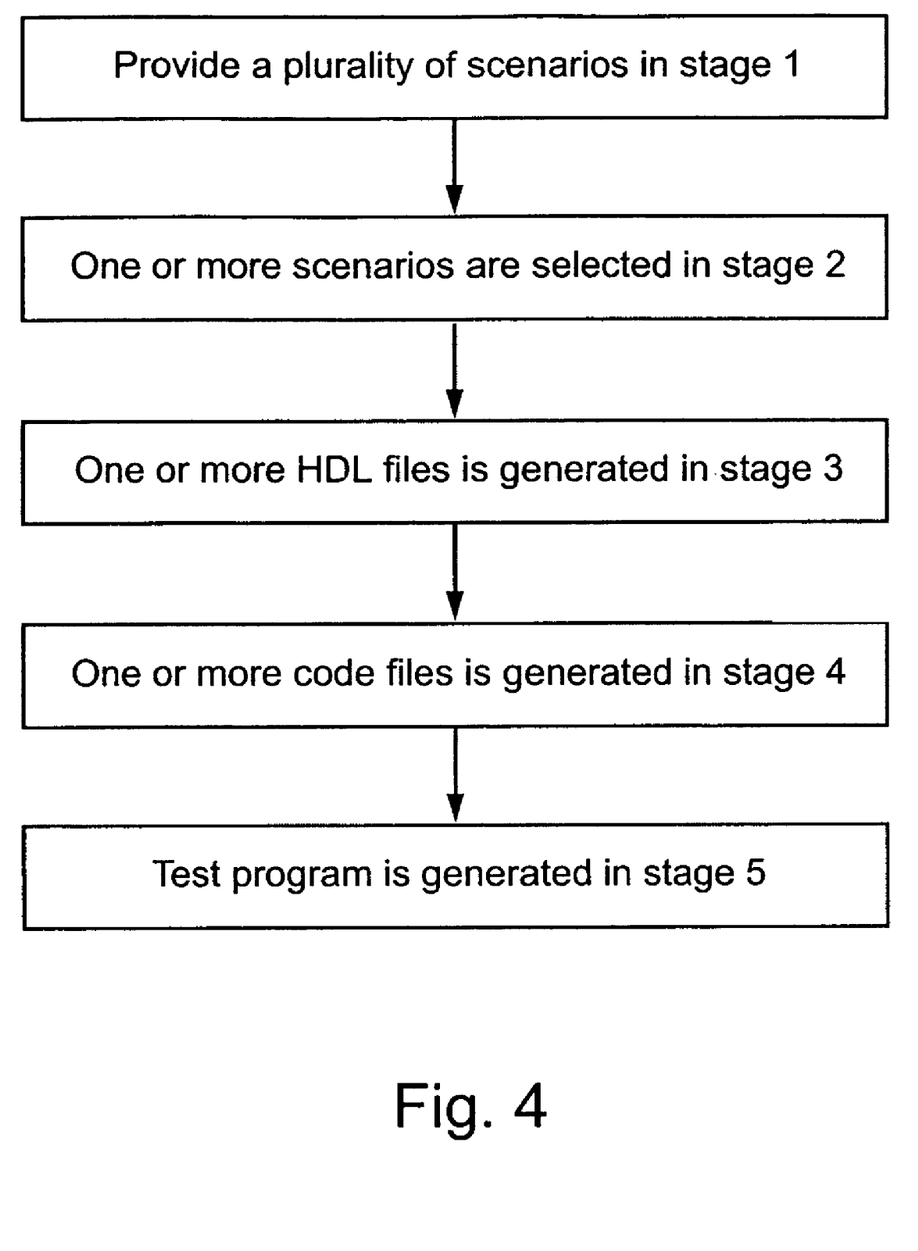
FIG. 4 is a flowchart of another exemplary method according to the present invention for generating a test program with two stage generation.

FIG. 4 is a flowchart of another exemplary method according to the present invention for generating a test program from a scenario program with two stage generation.

In stage 1, optionally a plurality of scenarios is provided as for the method of FIG. 2. In stage 2, one or more scenarios are selected. Optionally and preferably, a plurality of scenarios are selected according to their respective constraints, as described above, and combined to form a combined scenario instance.

Next, in stage 3, an HDL (hardware description language) file for defining the simulation model according to the scenario program is preferably created. Also optionally and preferably, in stage 4, code is generated for executing this plurality of instructions for the scenario program. The code may optionally and more preferably include e language code, for example in one or more e language files. Stages 1-4 are preferably included in the first stage of the test program generation process.

In the second stage, starting with stage 5, the test program itself is preferably generated from the scenario program. Optionally and more preferably, the values for various fields are preferably generated as part of the test program generation process. This process is more preferably randomized. Stage 5 may optionally be performed during both the test pre-generation and run-time stages for test program generation.

A non-limiting, illustrative example of the above two stage generation process is provided below.

For this example, a multi port device is assumed. The device is tested with variable configurations, for example 2 ports, 5 ports and so forth. The simulation model for the device itself needs to be defined in Verilog HDL; different configurations require different top level HDL files to be created.

```
<'
extend sys {
    number_of_ports :uint;
    keep number_of_ports in [1..5];
    post_generate( ) is also {
        // write a top level Verilog file with the
        // appropriate number of ports
    };
};
'>
```

After generating the test, a new top level Verilog file is created, which needs to be compiled and loaded into the simulator before the test can continue. Loading the above example causes the scenarios to be run with the selected configuration, e.g. the number of ports picked by the generation process for the first phase.

Figure 5:
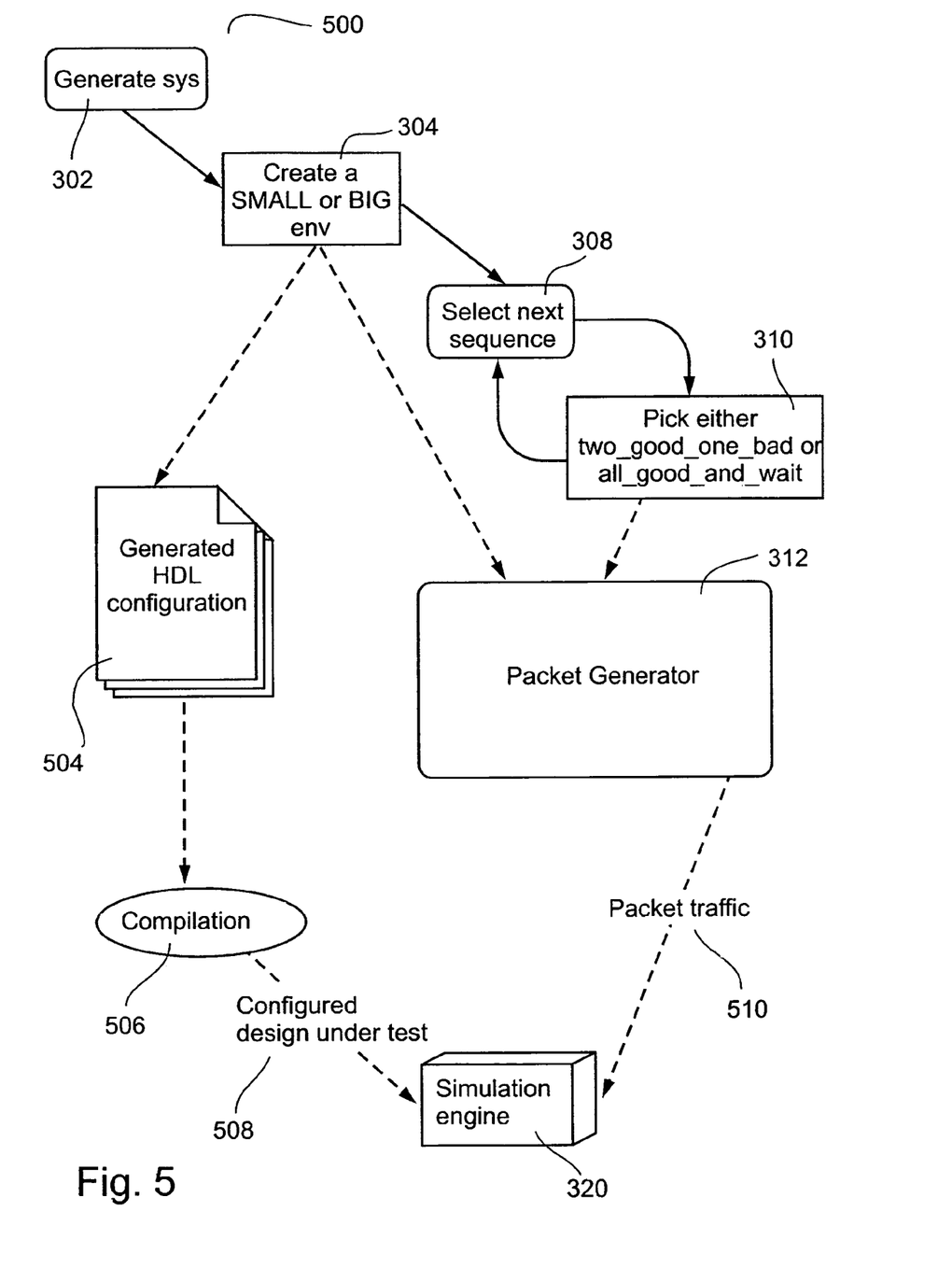
FIG. 5 is a schematic block process diagram of an example of the method according to FIG. 4 for test generation.

FIG. 5 is a schematic block process diagram of an example of the method according to FIG. 4 for test generation. Components or processes with identical or at least similar functions to those of FIG. 3 have the same reference numbers and are not further discussed herein. Packet generator 312 is shown in a simplified manner for clarity only and without any intention of being limiting in any way.

For the two stage process, unlike for FIGS. 2 and 3, a process system 500 also includes a generated HDL configuration 504 which determines the configuration of the DUT itself by generating an HDL file (alternatively, the configuration may optionally be selected first, followed by generating an HDL file according to the selected configuration). Such an HDL file is an example of an external file that is generated in the first stage.

The generated external file is compiled in process 506, which results in a configured DUT 508. The configured DUT 508 is fed into simulation engine 320, along with the output of packet generator 312, which is shown as packet traffic 510. Packet traffic 510 is actually identical to generated input 318 of FIG. 3, but is addressed by a separate term and reference number to avoid confusion.

What is claimed is:

1. A method stored on a computer readable medium including computer executable instructions for automatically generating at least one test program from a set of scenarios for testing a simulation model of a device under test (DUT) in a test environment during a test verification process, the method comprising:

providing a plurality of scenarios, each scenario containing at least one operation and at least one constraint indicative of which other scenarios may be compatible therewith for the test program;

selectively defining a set of scenarios from said plurality of scenarios according to said constraints thereof by resolving conflicts among said constraints, said set of scenarios excluding conflicting scenarios; and automatically generating the test program by combining said set of scenarios to provide at least one operation as input for driving simulated operation of the DUT.

2. The method of claim 1, wherein said selectively defining a set of scenarios comprises: selecting a number of said plurality of scenarios according to meta-data contained in at least one scenario; and combining said number of said plurality of scenarios to form a combined scenario instance.

3. The method of claim 2, wherein at least one selected scenario comprises a sequence.

4. The method of claim 3, wherein at least one selected scenario conflicts with at least one non-selected scenario and wherein said meta-data comprises information about said conflict.

5. The method of claim 1, wherein said selecting at least one of said plurality of scenarios is performed at least partially according to a configuration of the DUT.

6. The method of claim 1, wherein said providing said scenarios is performed during a scenario creation process.

7. The method of claim 6, wherein a user performs said scenario creation process.

8. The method of claim 1, wherein said providing said plurality of scenarios is performed by a user.

9. The method of claim 1, further comprising: generating at least one external file according to said at least one scenario.

10. The method of claim 9, further comprising: using said at least one external file at run time for running the test.

11. The method of claim 10 further comprising:
compiling said at least one external file before said using said at least one external file.

12. The method of claim 10, wherein said generating said at least one external file is performed before or concurrently with said generating said test.

13. The method of claim 10, wherein said external file comprises an HDL (hardware description language) file for configuring the simulation model.

14. The method of claim 1, wherein said generating the test is performed according to an at least partially randomized process.

15. The method of claim 14, wherein said randomized process is based upon a plurality of constraints, and wherein said plurality of constraints is provided in said selected scenario.

16. The method of claim 1, wherein said generating the test is performed according to said at least one constraint.

17. The method of claim 16, wherein each constraint defines a type of expected input variable and a type of operation to be performed on said type of expected input variable.

18. The method of claim 17, wherein said constraint comprises a static constraint on a value of said type of expected input variable.

19. The method of claim 17, wherein said constraint comprises a dynamic constraint on a value of said type of expected input variable.

20. The method of claim 17, wherein said at least one type of expected input variable is at least partially determined according to a simulation model of the DUT.

21. The method of claim 1, wherein at least one characteristic of said constraint determines whether said constraint conflicts with another constraint.

22. The method of claim 1, wherein the simulation model comprises a plurality of variables, wherein at least one scenario comprises a monitoring operation for monitoring behavior of the simulation model and wherein said monitoring operation comprises sampling at least one value of at least one variable of the simulation model.

23. The method of claim 1, wherein the selectively defining a set of scenarios from said plurality of scenarios according to said at least one constraint is accomplished by automatically selecting a subset of said plurality of scenarios by resolving said constraints of said plurality of scenarios to include in the selected subset only non-conflicting scenarios.

* * * * *

UNITED STATES PATENT AND TRADEMARK OFFICE
CERTIFICATE OF CORRECTION

| | | |
|---|---|---|
| PATENT NO. | : 7,665,067 B2 | Page 1 of 1 |
| APPLICATION NO. | : 10/661772 | |
| DATED | : February 16, 2010 | |
| INVENTOR(S) | : Hollander et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1387 days.

Signed and Sealed this

Seventh Day of December, 2010

David J. Kappos
*Director of the United States Patent and Trademark Office*